`US007024171B2`

(12) United States Patent
Gibbs (10) Patent No.: US 7,024,171 B2
(45) Date of Patent: Apr. 4, 2006

(54) FRACTIONAL-N FREQUENCY SYNTHESIZER WITH CASCADED SIGMA-DELTA CONVERTERS

(75) Inventor: John Gibbs, Lynnwood, WA (US)

(73) Assignee: ICOM America, Incorporated, Bellevue, WA (US)

( * ) Notice: Subject to any disclaimer, the term of this patent is extended or adjusted under 35 U.S.C. 154(b) by 507 days.

(21) Appl. No.: 10/373,353

(22) Filed: Feb. 25, 2003

(65) Prior Publication Data

US 2004/0164809 A1    Aug. 26, 2004

(51) Int. Cl.
 *H04B 1/06*    (2006.01)
(52) U.S. Cl. .................. 455/260; 455/76; 455/112; 455/216; 375/375; 375/373
(58) Field of Classification Search ................ 455/260, 455/76, 112, 113, 135–138, 165.1, 169.2, 455/180.3–186.1, 205, 208, 216, 261–265, 455/255, 313, 192.1, 192.2, 424, 425, 456.5, 455/456.6, 550.1, 575.1, 196.1, 198.1, 315, 455/318; 375/376, 371, 316, 344, 373, 375, 375/362, 247; 331/16, 1 R, 25, 34, 51; 377/48, 377/41, 52; 341/143, 144, 156, 131; 327/105, 327/107, 113, 115, 117, 157, 156, 158, 159
See application file for complete search history.

(56) References Cited

U.S. PATENT DOCUMENTS 3,976,945 A    8/1976  Cox
4,694,475 A    9/1987  Mehrgardt
4,758,802 A    7/1988  Jackson (Continued)

OTHER PUBLICATIONS

Cris E. Hill: "All Digital Fractional-N Synthesizer for High Resolution Phase Locked Loops", Applied Microwave & Wireless, Part 1, pp. 62-69, Nov./Dec. 1997.

(Continued)

*Primary Examiner*—Nguyen T. Vo
*Assistant Examiner*—Charles Chow
(74) *Attorney, Agent, or Firm*—Frishauf, Holtz, Goodman & Chick, P.C.

(57) ABSTRACT

Frequency synthesizer utilizing fractional-N synthesis includes a phase detector having an input receivable of a reference frequency, a loop filter arranged to receive the signal from the phase detector, a tunable oscillator arranged to receive a tuning signal generated by the loop filter and provide an output frequency and an integer divider arranged to receive the output frequency of the oscillator, divide it by a division control number (N+F) and provide the divided output frequency to the phase detector. The division control number is made up of an integer (N) and a fraction portion (F) separated into at least two different fractions. The fraction portion is generated by at least two sigma-delta converters, each processing a respective fraction with the sigma-delta converter processing a smaller fraction being driven at a lower clock rate than a sigma-delta converter processing the largest fraction. By driving the sigma-delta converter which processes a smaller fraction at a reduced clock rate, the sigma-delta converter can consume less power and be manufactured at reduced cost.

32 Claims, 7 Drawing Sheets

U.S. PATENT DOCUMENTS

| | | | |
|---|---|---|---|
| 4,800,342 A | | 1/1989 | Jackson |
| 4,965,531 A | * | 10/1990 | Riley .................. 331/1 A |
| 4,996,699 A | | 2/1991 | Rudolph |
| 5,038,117 A | * | 8/1991 | Miller .................. 331/16 |
| 5,055,802 A | | 10/1991 | Hietala et al. |
| 5,414,424 A | * | 5/1995 | Cabler .................. 341/143 |
| 5,600,320 A | * | 2/1997 | Wilson et al. .......... 341/144 |
| 5,777,521 A | * | 7/1998 | Gillig et al. ............ 331/16 |
| 5,903,194 A | * | 5/1999 | Opsahl et al. .......... 331/1 A |
| 6,603,360 B1 | * | 8/2003 | Kim et al. .............. 331/1 A |
| 6,728,526 B1 | * | 4/2004 | Yamada et al. ........ 455/260 |
| 6,823,033 B1 | * | 11/2004 | Fahim .................. 375/376 |
| 6,920,182 B1 | * | 7/2005 | Bolton, Jr. ............ 375/247 |
| 6,927,716 B1 | * | 8/2005 | Keaveney et al. ..... 341/143 |
| 2002/0121994 A1 | * | 9/2002 | Bolton, Jr. ............ 341/143 |
| 2003/0174026 A1 | * | 9/2003 | Adachi et al. .......... 332/117 |
| 2003/0201805 A1 | * | 10/2003 | Holland et al. ........ 327/113 |
| 2003/0235261 A1 | * | 12/2003 | Patana .................. 375/376 |
| 2004/0081266 A1 | * | 4/2004 | Adachi et al. .......... 375/376 |
| 2005/0182804 A1 | * | 8/2005 | Matsuno ................ 708/300 |

OTHER PUBLICATIONS

Cris E. Hill: "All Digital Fractional-N Synthesizer For High Resolution Phase Locked Loops", Applied Microwave & Wireless, Part 2 pp. 38-42, Jan./Feb. 1998.

Chipai Chou et al: "Reviewing Fractional-N Frequency Synthesis", Microwaves & RF, Jun. 1999, pp. 53-56.

Yiping Fan: "Model, Analyze, and Simulate $\Sigma\Delta$ Fractional-N Frequency Synthesizers", Part 1 of 2 parts, Microwave & RF, Dec. 2000, pp. 183-194 (no reduced clock rate, diff. structure).

Yiping Fan: "Model, Analyze, and Simulate $\Sigma\Delta$ Fractional-N Frequency Synthesizers", Part 2 of 2 parts, Jan. 2001,pp. 150-154 (no reduced clock rate, diff.structure).

Brain Miller: "A Multiple Modular Fractional Divider", IEEE Transactions on Instrumentation and Measurement, vol. 40, No. 3, Jun. 1991, pp. 578-583 (no reduced clock rate, diff.structure).

* cited by examiner

FRACTIONAL-N FREQUENCY SYNTHESIZER WITH CASCADED SIGMA-DELTA CONVERTERS

FIELD OF THE INVENTION

The present invention relates generally to frequency synthesizers utilizing fractional-N techniques and more particularly to fractional-N frequency synthesizers having cascaded sigma-delta converters.

BACKGROUND OF THE INVENTION

There is currently a trend in the radio market toward trunking radio systems and digital radio systems. Such radio systems require higher switching speeds than traditional single loop frequency synthesizers can provide at the required frequency resolution. In addition, regulatory agencies are requiring tighter channel spacing and assigning splinter frequencies. This has increased the local oscillator frequency resolution requirements of both analog and digital transceivers. In traditional single loop frequency synthesizers, switching time and phase noise go up as frequency resolution requirements tighten. In addition high data rate digital radio systems require lower phase noise and faster switching time than current analog radio systems.

Alternate technology of using separate receiving and transmitting frequency synthesizers can solve the switching speed problem but with higher costs, higher power consumption and the possibility of interference from the other frequency synthesizer. In addition, this approach does not solve the phase noise or frequency resolution problems.

Thus, there has developed a technique called fractional-N frequency synthesis which enables the use of a frequency synthesizer providing high switching speeds and low phase noise.

The origins of frequency synthesizers utilizing fractional-N techniques are divide-by-N frequency synthesizers including an integer divider arranged in a feedback loop from a tunable oscillator to a phase comparator provided with a reference frequency. Such frequency synthesizers generate an output frequency having a frequency which is an exact multiple of the reference frequency (the multiple being the integer N set in the integer divider). More specifically, such frequency synthesizers utilize a phase lock loop (PLL) to provide a variable frequency output signal having a selectable, precise and stable frequency.

Figure 1:
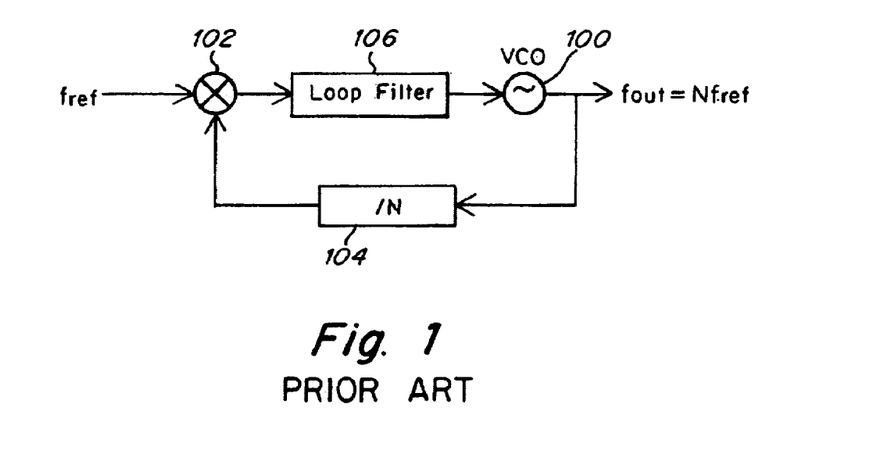
FIG. 1 is a schematic of a prior art frequency synthesizer.

Typically, as shown in FIG. 1, such a frequency synthesizer includes a voltage controlled oscillator (VCO) 100, a phase detector 102 (also commonly referred to as a phase comparator) and an integer divider or divisor circuit 104 interposed between the VCO 100 and the phase detector 102. The output frequency $f_{out}$ of the VCO 100 is divided by a selectable divisor N in the integer divider 104 and then compared to a known reference frequency $f_{ref}$ by means of the phase detector 102. The phase detector 102 generates an output signal that is proportional to the phase difference between the known reference frequency $f_{ref}$ and the output frequency from the VCO 100 after being divided by the divisor N in the integer divider 104 (the frequency being input to the phase detector 102 thus being $f_{out}/N$). The output of the phase detector 102 is coupled back to the input of the VCO 100 through a loop filter 106 to tune and lock the VCO 100 to a desired frequency. The output frequency $f_{out}$ of the VCO 100 will then be an exact multiple of the reference frequency ($f_{out}=N \ f_{ref}$). With the integer divider 104, the divisor can only be an integer so that the smallest increment in the output frequency $f_{out}$ is necessarily equal to the reference frequency, $f_{ref}$, itself, that is, the output signal can only be $f_{ref}$, $2f_{ref}$, $3f_{ref}$ etc. and cannot be a frequency between $f_{ref}$ and $2f_{ref}$ or between $2f_{ref}$ and $3f_{ref}$ etc.

A drawback of such a frequency synthesizer is that in order to provide a frequency synthesizer having a small step size between adjacent output frequencies, a very low reference frequency is required. Further, it is a drawback that in order to maintain the stability of the loop, the bandwidth of the filter 106 should be set at one tenth or less of the reference frequency. This narrow bandwidth results in slow switching time when switching from one output frequency to another. Finally, the low reference frequency causes a large multiplication of the inherent noise in the loop components, thereby increasing the phase noise on the output frequency.

Figure 2:
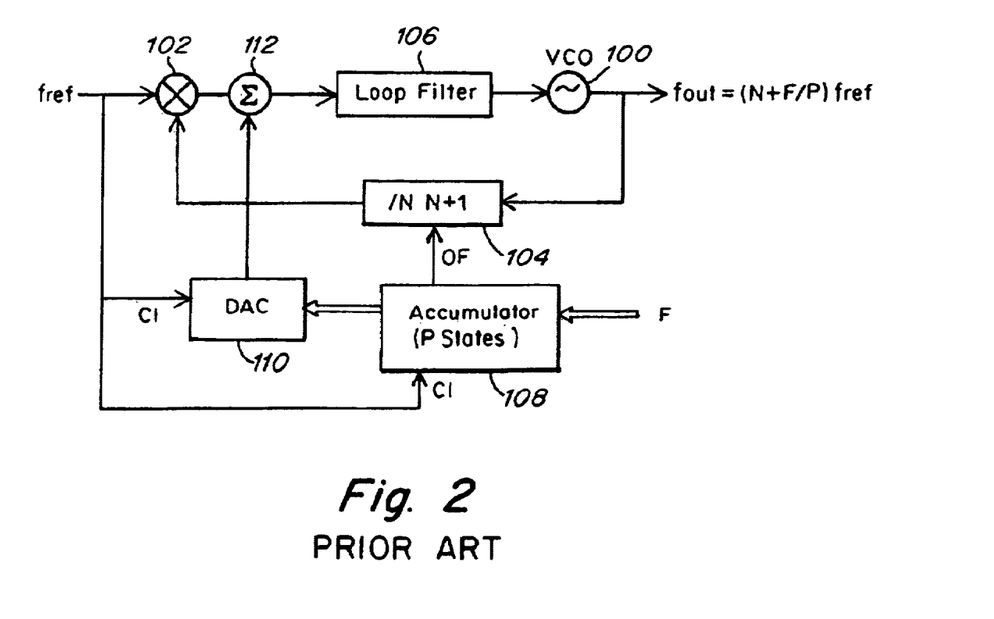
FIG. 2 is a schematic of a prior art frequency synthesizer using analog fractional-N synthesis.

In an attempt to address these drawbacks and limitations, a technique we call analog fractional-N synthesis was developed to synthesize an output signal having a frequency which is a rational number multiple of the reference frequency. A typical analog fractional-N synthesizer is shown in FIG. 2.

While the term "fractional synthesis" suggests division by a fractional value, the actual division is fractional only in terms of an average value. That is, since the integer divider 104 is able to divide only by an integer, fractional division is simulated by changing the divisor value temporarily during the course of an operation. Thus, a non-integer division ratio is realized by dividing by N+1, for example, instead of N, on a proportional number of division cycles to provide an average division ratio which approximates the desired divisor. This procedure is sometimes referred to as pulse swallow or pulse removal. The sequence of pulses to control the temporary changes in the divisor value is generated by an accumulator 108.

The accumulator 108 is a readily available electrical component which is driven at a clock frequency and provides an overflow or carry signal when it is completely full. The overflow signal is used to modify the divisor of the integer divider 104, for example, to change the divisor from N to N+1. The timing of the generation of the overflow signal is based on the number of states of the accumulator (designated P) and a desired fractional value programmed in the accumulator (designated F). Thus, the average value of the overflow signal of the accumulator 108 will represent the fraction F/P and will cause the divisor in the integer divider 104 to change from N to N+1 at the necessary times to cause the average output frequency $f_{out}$ of the VCO 100 to be equal to $(N+F/P)*f_{ref}$.

While the average output frequency is correct, it was found that a large phase error is generated by the phase detector. This phase error is substantially equal to the contents of the accumulator. Thus, to remove this phase error, a clocked digital-to-analog converter (DAC) 110 is added to provide the accumulator contents to a summer 112, interposed between the phase detector 102 and the loop filter 106, which cancels the error.

A drawback of frequency synthesizers utilizing analog fractional-N synthesis is that the phase detector has a large sawtooth phase error and therefore very accurate cancellation of this error is required to meet the needs of communication transceivers. As a practical matter, this means the reference frequency must be maintained at a relatively low frequency for suitable error cancellation (for example, 100–300 kHz) and also, the linearity of the phase detector and DAC are critical for cancellation of this error. As such, a frequency synthesizer utilizing analog fractional-N synthesis while an improvement over a divide-by-N frequency synthesizer, has a moderately slow switching speed and moderately high phase noise due to the low reference frequency required for error cancellation.

In view of the drawbacks and limitations of analog fractional-N synthesizers, frequency synthesizers based on sigma-delta converters or modulators were developed. Sigma-delta conversion is a well known technology used widely in analog-to-digital converters (ADCs) and digital-to-analog converters (DACs) in high performance products such as CD players.

Figure 3:
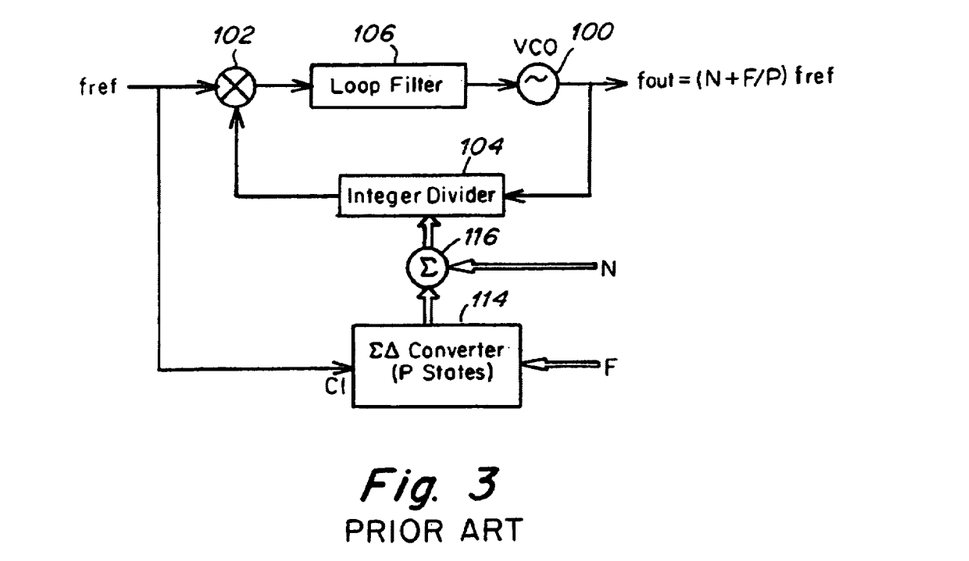
FIG. 3 is a schematic of a prior art fractional-N frequency synthesizer using a sigma-delta converter.

FIG. 3 is a block diagram of a fractional-N frequency synthesizer utilizing a sigma-delta converter. The frequency synthesizer includes a sigma-delta converter 114 and an integer divider 104 which divides the output frequency of the VCO 100 by a signal based on a division control number N+F/P. The division control number is made up of an integer portion N and a fractional portion F/P. The sigma-delta converter 114 receives the fractional value F, and a clock signal which is derived from the reference frequency $f_{ref}$ or the output frequency $f_{out}$. The sigma-delta converter 114 provides a series of integer value corrections as output which represents on average the fractional portion F/P. The integer value corrections are summed with the integer portion N in a summer 116 to obtain the division control number (N+F/P).

Figure 4:
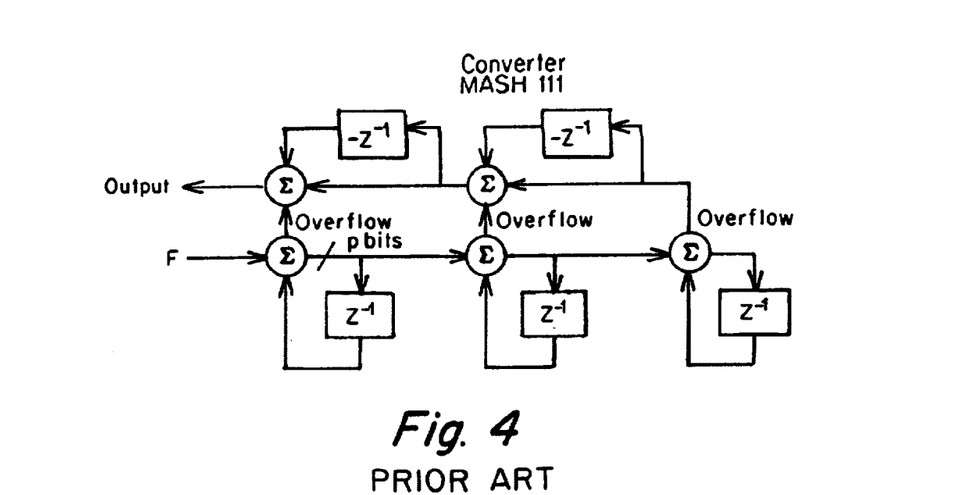
FIG. 4 is a schematic of a prior art sigma-delta converter.

FIG. 4 is a block diagram of a specific implementation of a sigma-delta converter often referred to as a MASH 111. The manner in which the converter functions to provide the fractional output F/P with P being the number of states in the accumulator is understood by those skilled in the art. For example, reference is made to U.S. Pat. Nos. 4,694,475, 4,758,802, 4,800,342, 4,996,699, 5,038,117 and 5,055,802 among others.

One of the properties of sigma-delta converters is that the phase error is never totally eliminated, but rather, it is changed from discrete spurious signals to noise and this noise is reduced at low frequencies by noise shaping.

In this regard, if noise from sigma-delta converter were flat, the spectral density would be proportional to $1/f_{ref}$. This would require a very high clock frequency in the sigma-delta converter to reduce the noise adequately for synthesizer applications. Instead, Sigma-Delta Converters are designed to shape the phase noise. For instance a MASH111 converter used in a fractional N synthesizer has an output phase noise spectrum of:

$$\delta^2 (2\pi)^2/(12 f_{ref})(1-z^{-1})^{2(m-1)} \text{ rad}^2/\text{Hz}$$

where m is the order of the sigma-delta converter, and $\delta$ is the quantizer step size. This step is equal to one for traditional sigma-delta fractional-N synthesis. For high sample rates (compared to loop bandwidth) and $\delta=1$, for a third order sigma-delta converter, the noise can be approximated as:

$$(2\pi)^2/(12 f_{ref}) (2\pi f/f_{ref})^4 \text{ rad}^2/\text{Hz}$$

(See, for example, Brian Miller, A Multiple Modulator Fractional Divider". IEEE Transactions on Instrumentation and Measurement, vol. 40, No. 3, June 1991, pp. 578–583). Thus, if the order and bandwidth of the PLL are selected correctly, the noise from the Sigma-Delta Converter will be low inside of the loop bandwidth and the PLL will filter off the Sigma-Delta noise at higher frequencies.

There are practical limitations on the fractional-N frequency synthesizer shown in FIG. 3. For example, a higher phase detector linearity is required than in frequency synthesizers using analog fractional-N techniques since, for instance, a MASH111 sigma-delta converter changes N by eight counts (from −3 to +4) instead of two counts (0 and 1) in the analog fractional-N technique. Thus, the performance of the frequency synthesizer shown in FIG. 3 can be limited by phase detector linearity.

Another drawback of the use of the sigma-delta converter shown in FIG. 4 is that the calculations in the accumulators and the differentiators are performed at the reference frequency. In view of the relatively large number of bits involved in the computation of the integer for the integer divider 104, a large number of computations must be performed resulting in relatively large power requirements.

There have been numerous attempts to improve the performance of fractional-N frequency synthesizers by reducing spurious signals and noise. Of particular interest, U.S. Pat. No. 4,965,531 (Riley) describes a frequency synthesizer including a fractional-N divider having two sigma-delta converters connected in cascade by means of a summer. The output control signal of one sigma-delta converter is applied to the input of the summer which combines the output control signal with another control signal. The combined control signal is applied to the other sigma-delta converter. The output control signal of this sigma-delta converter is said to be capable of displacing quantization noise in the signal away from frequencies of the phase control signal being directed to the phase detector as well as multiple thereof.

A significant drawback of the frequency synthesizer of Riley is that both sigma-delta converters are driven at the same clock frequency, i.e., the output frequency from the integer divider. As such, Riley does not achieve any reductions in costs or computational load resulting from the use of cascading sigma-delta converters since both sigma-delta converters are driven at the same relatively high clock frequency.

It would thus be advantageous to provide a fractional-N frequency synthesizer which offers the same elimination of noise and spurious signals, and has a reduced cost in comparison with prior art frequency synthesizers, because it requires fewer computations than prior art frequency synthesizers.

OBJECTS AND SUMMARY OF THE INVENTION

It is an object of the present invention to provide a new and improved fractional-N frequency synthesis technique which has a lower cost and a lower power requirement than prior art techniques thereby enabling its use, for example, in mass-produced electronic devices such as hand-held radios and battery-operated equipment.

It is another object of the present invention to provide a new and improved fractional-N frequency synthesizer having multiple sigma-delta converters which reduces the number of computations during the generation of an integer for an integer divider.

It is another object of the present invention to provide a new and improved frequency synthesizer having multiple sigma-delta converters, at least one of which processes a small fraction of the division control number and which can be driven at a reduced clock rate relative to another sigma-delta converter without adversely affecting the noise generated by the frequency synthesizer.

In order to achieve these objects and others, a frequency synthesizer utilizing fractional-N synthesis in accordance with the invention includes a phase detector having an input receivable of a reference frequency, a loop filter arranged after the phase detector, a tunable oscillator arranged to receive a control signal generated by the phase detector and passed through the loop filter and provide an output frequency and an integer divider arranged to receive the output frequency of the oscillator, divide the output frequency by a division control number (N+F) and provide the divided output frequency to the phase detector. The division control number is made up of an integer (N) and a fraction portion (F) separated into at least two different fractions. In accordance with the invention, the fraction portion is generated by at least two sigma-delta converters, each processing a respective fraction with the sigma-delta converter processing a smaller fraction being driven at a lower clock rate than a sigma-delta converter processing the largest fraction.

By driving the sigma-delta converter which processes a smaller fraction, i.e., the lower order bits when the fraction portion of the division control number is represented in binary format with each fraction being represented by a group of successive bits, at a reduced clock rate, the sigma-delta converter which processes the smaller fraction has a simpler construction, e.g., lower order and therefore has reduced costs and lower computational loads.

Further, in spite of the reduction in clock rate of the lower sigma-delta converter(s), no significant increase in noise or spurious signals is generated. This results primarily from the fact that phase noise is reduced as a function of the digit position, i.e., the position of the bits in the fraction portion of the fraction control number. Thus, lower order bits do not generate as much phase noise error as higher order bits. Accordingly, a reduction in the clock rate is possible for the processing of the lower order bits without resulting in an increase in phase noise error.

The sigma-delta converters are cascaded in the sense that the output from the sigma-delta converter processing the smallest fraction is input to the sigma-delta converter processing the next largest fraction, and so on. That is, the output of one sigma-delta converter is derived from the output of another sigma-delta converter. A summer is typically interposed between sequential sigma-delta converters to combine the output of one sigma-delta converter with an additional fraction value.

More specifically, when two cascading sigma-delta converters are provided with the output of the first being derived partially from the output of the second, the second receives a fractional value (F2) and outputs a series of integers whose average value equals a fraction F2/P2. A summer combines the fraction F2/P2 and a fractional value (F1) and provides the sum to the first sigma-delta converter which outputs a series of integers whose average value equals the fraction F1/P2+F2/(P1 P2) which constitutes the fraction portion of the division control number. In this case, since the second sigma-delta converter is processing a smaller fraction than the first sigma-delta converter, it is driven at a lower clock rate than the first sigma-delta converter.

To obtain a lower clock rate, a frequency divider can be used with the undivided clock frequency being used as input to the first sigma-delta converter and the divided clock frequency being used as input to the second sigma-delta converter. The clock frequency may be either the reference frequency or the output frequency of the integer divider.

The fractional values provided or programmed into the sigma-delta converters are determined based on the fraction portion of the division control number and the number of states in the sigma-delta converters. More specifically, the desired output frequency is divided by the reference frequency to obtain a number having an integer and a fraction.

The fraction can be represented in binary format with each fraction being formed from a group of successive bits. For example, for number extended 24 bits after the binary point and for a synthesizer having three sigma-delta converters, the first eight bits after the binary point could constitute the largest fraction, the next eight bits could constitute the next largest fraction and a final eight bits could constitute the smallest fraction.

It is an advantage of the invention that the important noise-shaping property of the sigma-delta converters is not lost in view of the cascaded arrangement and reduced clock rate.

In an embodiment wherein three sigma-delta converters are provided with the output of the second being derived partially from the output of the third and the output of the first being derived partially from the output of the second, the third sigma delta converter receives a fractional value F3 and outputs a series of integers whose average value is the fraction F3/P3. A summer combines the fraction F3/P3 and a second fractional value (F2) and provides the sum F2+F3/P3 to the second sigma-delta converter which outputs a series of integers whose average value is the fraction F2/P2+F3/(P3 P2). A summer combines the second fraction F2/P2+F3/(P3 P2) and a fractional value F1) and provides the sum F1+(F2/P2+F3/(P3 P2)) to the first sigma-delta converter which outputs a series of integers whose average value is the fraction F1/P1+F2/(P2 P1)+F3/(P1 P2 P3)) which constitutes the fraction portion of the division control number.

In this case, since the third and second sigma-delta converters are processing a smaller fraction than the first sigma-delta converter, they can be driven at a lower clock rate than the first sigma-delta converter. Also, the third sigma-delta converter can be driven at a lower clock rate than the second sigma-delta converter so that each sigma-delta converter may be driven at a different clock rate. To obtain the different clock rates, one or more frequency dividers can be used.

A method for synthesizing a frequency utilizing fractional-N synthesis in accordance with the invention comprises the steps of inputting a reference frequency to a phase detector, directing an output of the phase detector to a loop filter, directing the output of the loop filter to a tunable oscillator, directing an output frequency from the oscillator to an integer divider, inputting a division control number made up of an integer and a fraction portion separated into at least two different fractions into the integer divider, generating the fractions using at least two sigma-delta converters, each processing a respective fraction, driving one of the sigma-delta converters processing a smaller fraction at a lower clock rate than one of the sigma-delta converters processing the largest fraction, dividing the output frequency from the oscillator by the division control number in the integer divider and directing the output frequency from the integer divider to the phase detector. Fractional values are input into the sigma-delta converters as required and one or more frequency divider are used to create the different clock rates.

A novel method for generating fractional values for input into sigma-delta converters designed to output an integer from −N to +M is also part of the invention. This method can be implemented entirely with software using a general purpose microprocessor.

In the method, a desired output frequency is divided by a reference frequency to obtain a division control number made up of an integer portion and a fraction portion. The fraction portion is separated into a plurality of fractions. The sigma-delta converters are arranged in a cascaded arrangement and a summer is arranged between each adjacent pair of cascaded sigma-delta converters and between the highest sigma-delta converter and an integer divider. Each summer receives an output from one of the sigma-delta converters and either the integer portion or one of the fractions. To prevent negative input into the sigma-delta converters, the output from each sigma-delta converter is increased by N, while at the same time, N is subtracted from the fractions or the integer portion being added by each summer. If necessary for the subtraction, borrowing from a higher fraction or the integer portion when the fraction is less than N is applied to thereby obtain modified fractions and a modified integer portion. When the sigma-delta converters are MASH111 converters, N equals 3 and M equals 4.

It is advantageous to pre-compute the modified fraction portions and modified integer portion for the desired frequency to reduce the computational load.

BRIEF DESCRIPTION OF THE DRAWINGS

The invention, together with further objects and advantages hereof, may best be understood by reference to the following description taken in conjunction with the accompanying drawings, wherein like reference numerals identify like elements and wherein.

DETAILED DESCRIPTION OF THE INVENTION

Referring now to FIGS. 5–8, a fractional-N frequency synthesizer in accordance with the invention is designated as 10 and comprises a tunable oscillator 12, such as a voltage controlled oscillator (VCO), a phase detector 14, an integer divider or divisor circuit 16 arranged in a feedback loop of the oscillator 12 to the phase detector 14, and a loop filter 18 interposed between the phase detector 14 and the oscillator 12.

A frequency synthesizer 10 in accordance with the invention also includes components for generating a division control number for the integer divider 16 which has an integer portion and a fraction portion made up of two or more fractions. By separating the fraction portion into multiple fractions, it is possible to increase the number of possible output frequencies generated by the frequency synthesizer 10, without significantly increasing the power consumption.

Generally, in accordance with the invention, the fraction portion of the division control number is generated by a plurality of sigma-delta converters arranged in a cascaded manner with each sigma-delta converter processing a respective fraction. The output of the lowest delta-sigma converter is thus provided to an immediately preceding sigma-delta converter with the output of the highest sigma-delta converter being provided to the integer divider 16. At the same time, the clock rate used to drive the sigma-delta converters is varied to enable the sigma-delta generators which provide small fractions of the division control number to be driven at a lower clock rate than a sigma-delta converter which provides the largest fraction of the division control number. In this manner, the sigma-delta converters which process small fractions perform fewer computations resulting in higher speeds and reduced costs of construction. Also, the sigma-delta converters which process small fractions can have a simpler construction than the sigma-delta converters which process larger fractions, e.g., fewer accumulators.

Figure 5:
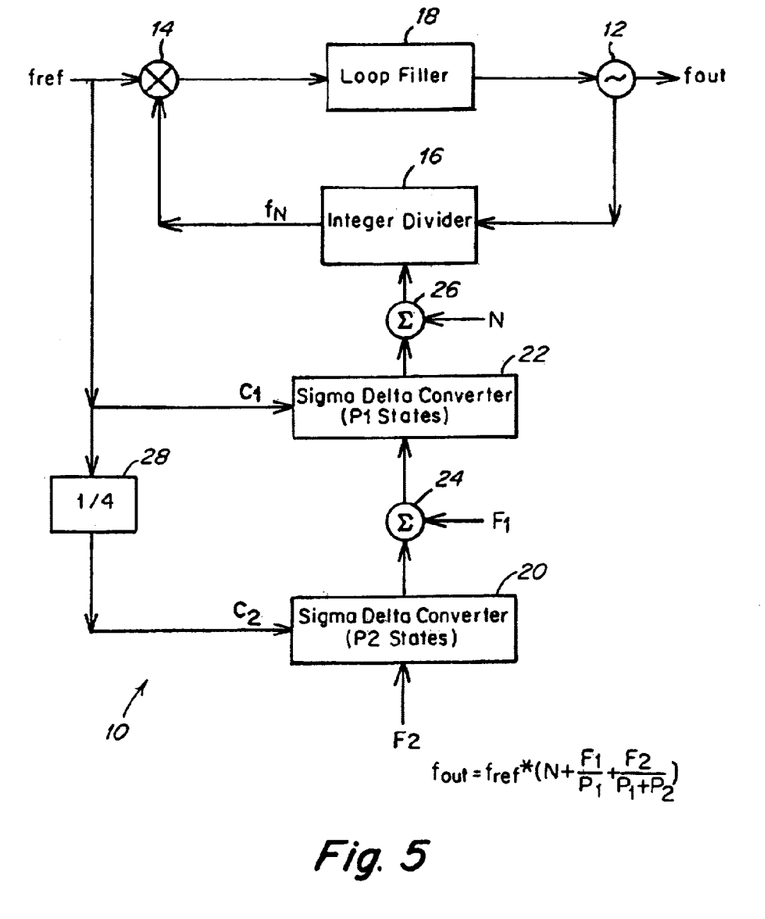
FIG. 5 is a schematic of a first embodiment of a frequency synthesizer in accordance with the invention.

In one embodiment shown in FIG. 5, two sigma-delta converters 20, 22 each provide a part of the fractional portion of the division control number. To create the fractional portion, sigma delta converter 20 is provided with a fractional value F2 and a clock signal C2 derived from the reference frequency $f_{ref}$. The sigma delta converter 20 has a number of input states (P2) and thus outputs a signal with an average value of the fraction F2/P2. This signal is directed to a summer 24 which also receives a fractional value F1 to create a signal with an average value of F1+F2/P2.

Sigma delta converter 22 receives as input the signal whose average value is F1+F2/P2 from the summer 24 and a clock signal C1 equal to the reference frequency $f_{ref}$. The sigma delta converter 22 has a number of input states (P1) and thus outputs as a signal which on average equals the fraction F1/P1+F2/(P1 P2). This signal is directed to a summer 26 which also receives an integer N to create a signal whose average value is N+F1/P1+F2/(P1 P2). The signal from the summer 26 is directed to the integer divider 16. Integer divider 16 thus outputs a frequency $f_N$ whose average value is equal to $f_{out}/(N+F1/P1+F2/(P1\ P2))$.

Accordingly, the phase detector 14 generates an output signal that is proportional to the phase difference between the known reference frequency $f_{ref}$ and the divider output frequency $f_N$. The output of the phase detector 14 is coupled back to the input of the oscillator 12 through the loop filter 18 to tune and lock the oscillator 12 to a desired frequency. The output frequency $f_{out}$ of the oscillator 12 will then be equal to $f_{ref}*(N+F1/P1+F2/(P1*P2))$.

An important feature of the invention is that the clock rate C1 driving the first sigma-delta converter 20 is lower than the clock rate C2 driving the second sigma-delta converter 22. To accomplish this, a frequency divider 28 is used to divide the reference frequency $f_{ref}$ by an integer, 4 in the illustrated embodiment. The undivided reference frequency is used as the clock rate C1 of the second sigma-delta converter 22. As such, the clock rate C2 of the first sigma-delta converter 20 is $f_{ref}/4$ whereas the clock rate C1 of the second sigma-delta converter 22 is $f_{ref}$.

Reducing the clock rate for a sigma-delta converter below the highest sigma-delta converter (the highest being the one immediately in line with the integer divider) significantly reduces the computational load of the sigma-delta converter resulting in reduced cost and power requirements for frequency synthesis. For example, with common integrated circuit technologies like CMOS, the power consumption drops approximately in half for the first sigma-delta converter when the clock rate C2 equal to $f_{ref}/4$ is used.

Also, although generally using a lower clock rate would result in an increase in noise generated by the frequency synthesizer, it has been found that the total noise is not affected by reducing the clock rate of the sigma-delta converter 20 which processes lower order bits of the fraction portion of the division control number.

For instance, if the number of bits in the highest sigma-delta converter=8 and the clock C2 is ¼ the frequency reference, then the noise from second sigma-delta converter 20 is:

$$(\delta/2^8)^2(2\pi)^2/(12f_{ref}/4)(2\pi f/(f_{ref}/4))^4 \text{ rad}^2/\text{Hz} = \frac{1}{64}*(2\pi)^2/(12f_{ref})(2\pi f/f_{ref})^4 \text{ rad}^2/\text{Hz}$$

or 18 dB below the noise of the first sigma-delta converter 22.

In addition, the noise from a third sigma-delta converter if present below the second sigma-delta converter 20 (see the embodiment shown in FIG. 6) would be reduced another 48 dB below the second sigma-delta converter if its number of bits equals eight and it is clocked at the same rate as the second sigma-delta converter.

As used herein, the signals generated by the sigma-delta converters are bit streams with the average signal $F1/P1+F2/(P1\ P2)$ being representative of the bit stream needed to control the changing of the divisor in the integer divider 14 to achieve the desired output frequency. As such, once the desired output frequency is determined, and the number of bits in the sigma-delta converters 20,22 is known, the fractional values F1 and F2 are readily determined in a manner known to those skilled in the art.

Figure 9:
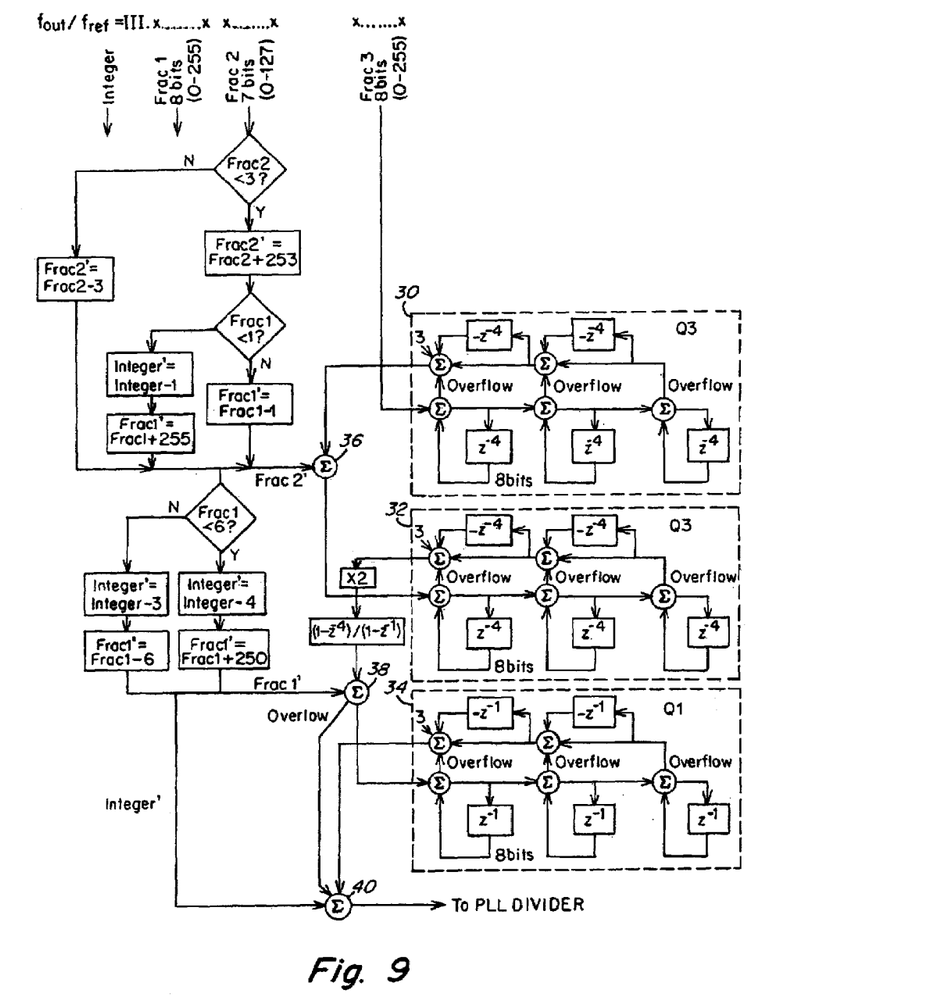
FIG. 9 is a flowchart of the operation of one embodiment of the frequency synthesizer in accordance with the invention.

The sigma-delta converters 20,22 used in accordance with the invention may be any type of sigma-delta converter or modulator known in the art. For example, MASH sigma-delta converters may be used as shown in FIG. 9.

Figure 6:
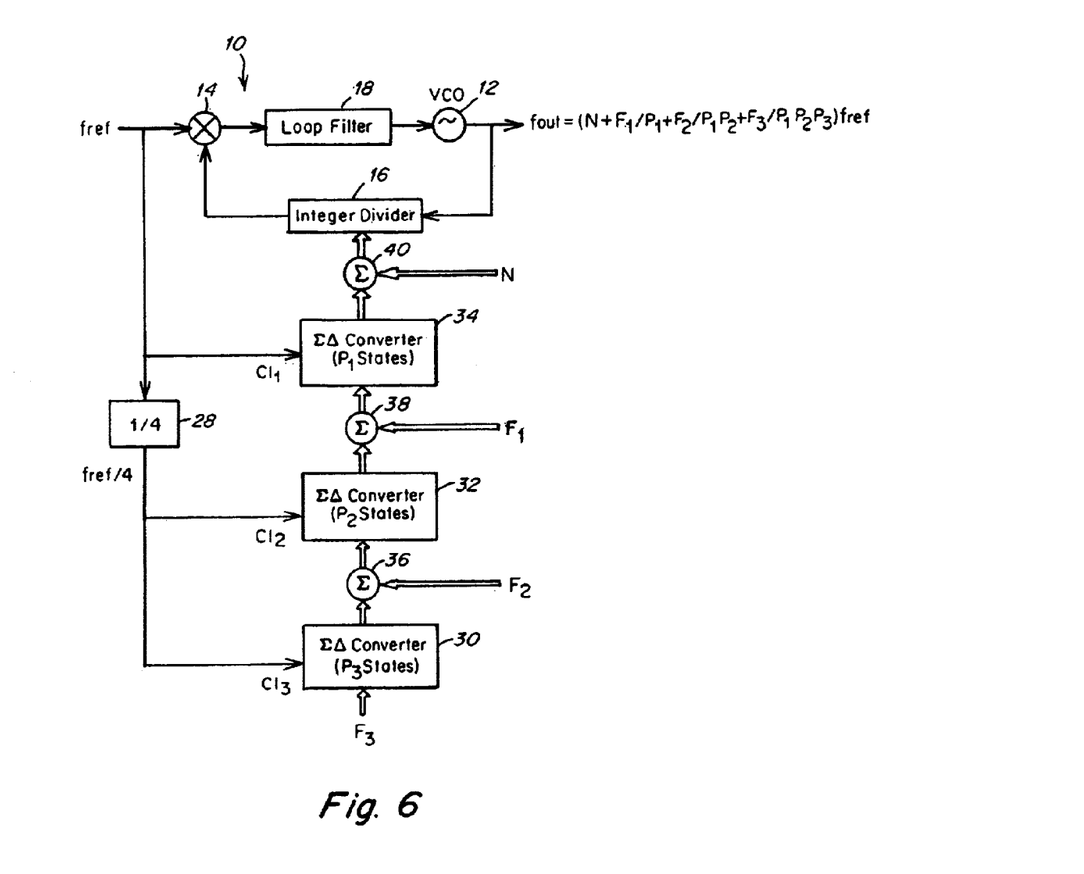
FIG. 6 is a schematic of a second embodiment of a frequency synthesizer in accordance with the invention.

Referring now to FIG. 6, in this embodiment three sigma-delta converters 30, 32, 34 provide the fraction portion of the division control number. To create the fraction portion, sigma delta converter 30 is provided with a fractional value F3 and a clock signal C3 derived from the reference frequency $f_{ref}$. The sigma delta converter 30 has a number of input states (P3) and thus outputs as a signal with an average value of the fraction F3/P3. This signal is directed to a summer 36 which also receives a fractional value F2 to create a signal whose average value is F2+F3/P3.

Sigma delta converter 32 receives as input the signal F2+F3/P3 from the summer 36 and a clock signal C2 derived from the reference frequency $f_{ref}$. The sigma delta converter 32 has a number of input states (P2) and thus outputs a signal with the average value of the fraction F2/P2+F3/(P2*P3). This signal is directed to a summer 38 which also receives a fractional value F1 to create a signal with the average value of F1+F2/P2+F3/(P2*P3).

Sigma delta converter 34 receives as input the signal whose average value is F1+F2/P2+F3/(P2*P3) from the summer 38 and a clock signal C1 derived from the reference frequency $f_{ref}$. The sigma delta converter 34 has a number of input states (P1) and thus outputs a signal with an average value of the fraction F1/P1+F2/(P1*P2)+F3/(P1*P2*P3). This signal is directed to a summer 40 which also receives an integer N to create a signal with the average value of N+F1/P1+F2/(P1*P2)+F3/(P1*P2*P3). The signal from the summer 40 is directed to the integer divider 16.

Accordingly, the phase detector 14 generates an output signal that is proportional to the phase difference between the known reference frequency $f_{ref}$ and the frequency from the integer divider 16 ($f_{out}/(N+F1/P1+F2/(P1*P2)+F3/(P1*P2*P3))$. The output of the phase detector 14 is coupled back to the input of the oscillator 12 through the loop filter 18 to tune and lock the oscillator 12 to a desired frequency. The output frequency $f_{out}$ of the oscillator 12 will then be an exactly equal to $f_{ref}(N+F1/P1+F2/(P1*P2)+F3/(P1*P2*P3))$.

In this embodiment, the clock rate C3, provided to the lowest sigma-delta converter 30, and the clock rate C2, provided to the intermediate sigma-delta converter 32, are lower than the clock rate C1, provided to the highest sigma-delta converter 34. To accomplish this, the frequency divider 28 is used to divide the reference frequency $f_{ref}$ by an integer, 4 in the illustrated embodiment. The undivided reference frequency $f_{ref}$ is used as the clock rate C1 of the sigma-delta converter 34. As such, the clock rate of the sigma-delta converters 30,32 is $f_{ref}/4$ whereas the clock rate of the sigma-delta converter 34 is $f_{ref}$.

As noted above, by reducing the clock rate for the lower fractions of the fraction portion of the division control number which are processed by the lower sigma-delta converters 30,32, the computational load on these sigma-delta converters 30,32 is reduced. Also, these sigma-delta converters 30,32 can be of lower order than the sigma-delta converter 34, which further reduces the computational load.

The performance of the frequency synthesizer shown in FIG. 6 would be ideal if the phase detector 14 produced an impulse at the reference frequency with the impulse amplitude representing the phase error. However, the actual output of the phase detector 14 is typically pulse width modulated (PWM) with the start (or end) of the pulse at the reference frequency zero crossing.

In one embodiment, to remove the timing error of the PWM, a sample and hold amplifier is used before the VCO 12 to improve performance. Another advantage obtained by the use of the sample and hold amplifier is that spurs of the reference frequency are removed.

Figure 7:
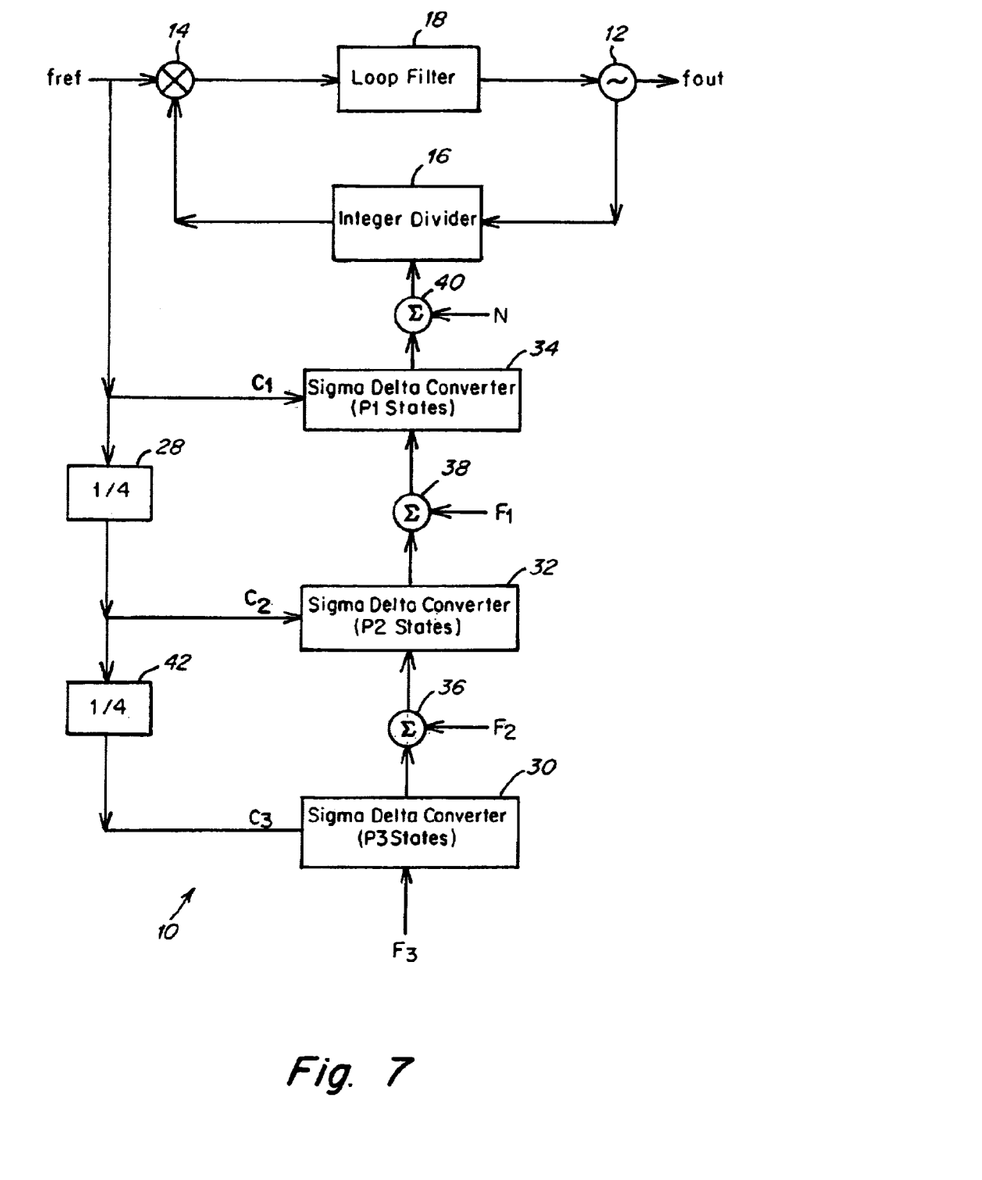
FIG. 7 is a schematic of a third embodiment of a frequency synthesizer in accordance with the invention.

As shown in FIG. 7, an additional frequency divider 42 can be used to further reduce the clock rate for the lowest sigma-delta converter 30. As such, the clock rate C3, provided to the lowest sigma-delta converter 30, is lower than the clock rate C2 provided to the intermediate sigma-delta converter 32 and the clock rate C2, provided to the intermediate sigma-delta converter 32, is lower than the clock rate C1, provided to the highest sigma-delta converter 34. To accomplish this, the frequency divider 42 further divides the divided reference frequency by an integer, 4 in the illustrated embodiment. The undivided reference frequency is used as the clock rate of the sigma-delta converter 34. The clock rate of the sigma-delta converter 32 is $f_{ref}/4$ whereas the clock rate of the sigma-delta converter 32 is $f_{ref}/16$.

In the embodiments shown in FIGS. 5–7, the clock rate for driving the sigma-delta converters was derived from the reference frequency $f_{ref}$.

Figure 8:
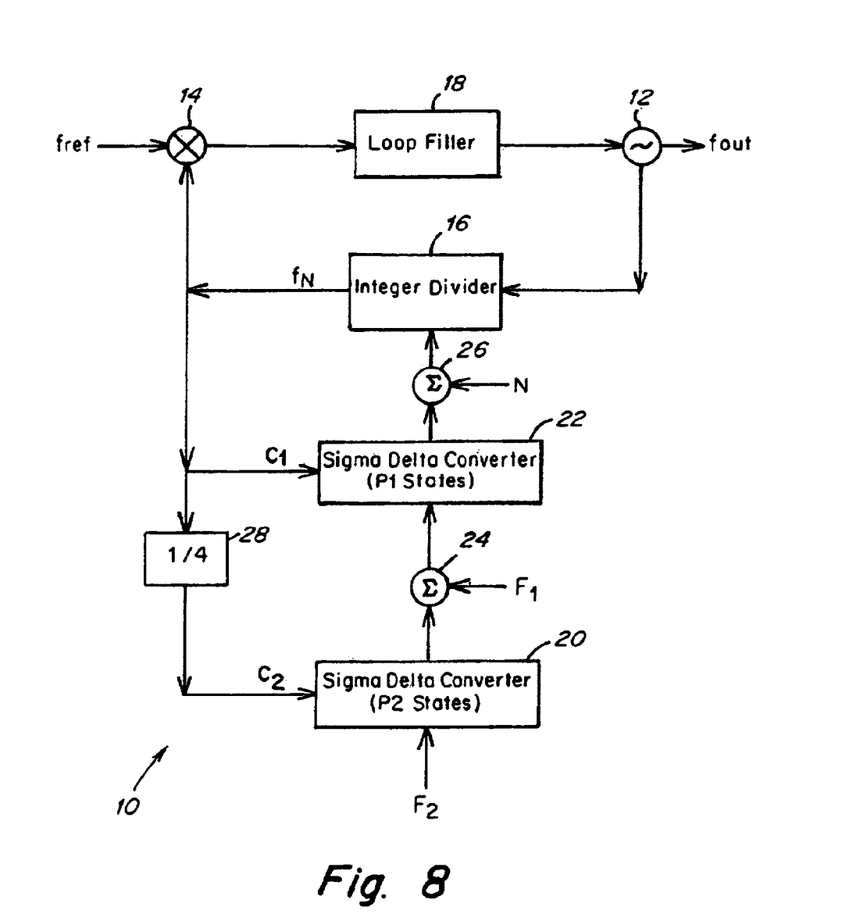
FIG. 8 is a schematic of a fourth embodiment of a frequency synthesizer in accordance with the invention.

However, as shown in FIG. 8, it is also possible to use the frequency generated by the integer divider 16 to drive the clock rates for driving the sigma-delta converters. Thus, the output frequency $f_N$ from the integer divider 16 is provided to the sigma-delta converter 22 and to the frequency divider 28. As such, the clock rate of the sigma-delta converter 22 is $f_N$ whereas the clock rate of the sigma-delta converter 20 is $f_N/4$.

The same technique of using the output frequency $f_N$ of the integer divider instead of the reference frequency to drive the clock rates of the sigma-delta converters can be used in all of the embodiments herein.

The prior art contains numerous additional features that can be incorporated into the invention, some involving the construction of the sigma-delta converters. Others involve the use of filters to reduce noise.

In the embodiments described above, the integer provided to the integer divider is changed to obtain the desired output frequency. However, it is also possible in accordance with the invention to change the prescale counter. In this connection, VHF and UHF synthesizers usually implement the divide by integer function using a CMOS integer divider preceded by a prescaler. The CMOS divider has a relatively low cost and low power consumption while the prescaler has a relatively high speed. To set the loop frequency, both the prescaler and CMOS integer divider must be programmed. Accordingly, sigma-delta fractional-N synthesizers typically required both components to be programmed every clock cycle.

It has now been found that by biasing the output of the sigma-delta converter(s) so that the output is always non-negative, the programming of the prescaler and integer divider every clock cycle can be simplified. For example, for a MASH111 sigma-delta converter, the number 3 is added to the output for integers from 0 to 7. In this manner, it is not necessary for the sigma-delta converter to change the CMOS divider, but rather a change of only the prescaler is now required. This reduces the speed requirements on the interface circuit and because the counter used in the prescaler is idle most of the reference cycle, the timing for loading the next cycle's division is not critical.

Referring now to FIG. 9, the concept of the invention can be implemented through software using a general purpose microprocessor and FIG. 9 is a flow chart of such software. The output frequency $f_{out}$ is determined and divided by the reference frequency $f_{ref}$ to obtain an integer portion and a fraction portion which is divided into three fractions designated frac1 (the first eight bits after the decimal point), frac2 (the next seven bits after the eight bits of frac1) and frac3 (the next eight bits after the seven bits of frac2). With respect to frac2, a routine is created to subtract 3 from frac2, if necessary, borrowing from the higher fraction (frac1) and the integer. More specifically, a determination made whether frac2 is less than 3. If not, then 3 is subtracted from frac2 to provide a modified frac2', which is equal to frac2−3. If frac2 is less than 3, then a modified frac2' is determined to be frac2+253 ($2^8$−3) and frac1 is reduced by 1 to provide a modified frac1' equal to frac1−1. However, if frac1 is less than 1, then the integer is reduced by 1 (modified integer' equals integer−1) and modified frac1' equals frac1+255 ($2^8$−1). The modified frac2' is used as the input fraction to the summer preceding to the appropriate sigma delta converter, in the embodiment of FIG. 6, the summer 36 preceding to sigma delta converter 32. The same subtraction scheme may also be applied to frac1.

The subtraction of 3 from frac2 (and optionally other fractions) is beneficial because a MASH111 sigma-delta converter outputs an integer from −3 to +4. As such, when the output of the third sigma-delta converter 30 (in the embodiment of FIG. 6) is added to F2, the result from summer 36 could be negative if F2 is less than 3. This causes the sigma-delta converter 32 to be unnecessarily complicated to compensate for negative inputs (in view of the fact that sigma-delta converters are typically designed for positive inputs only.) The same problem occurs for the output of the second sigma-delta converter 32 when adding to F2 as well as to the output of any sigma-delta converter preceding another sigma-delta converter.

Accordingly, to solve this problem, the output of each sigma-delta converter is increased by 3 to be an integer from 0 to 7 (instead of from −3 to +4). To compensate for this increase in the output from the sigma-delta converters or the average frequency, each number (fraction or integer) added to the sigma-delta converter output via a summer is decreased by 3. Decreasing by 3 means that borrowing from the next higher fraction (or integer) may be necessary. This borrowing does not have to be done on every clock cycle, it can be pre-computed once whenever the frequency is changed.

Additional processing is implemented to frac1. Specifically, if frac1 is less than 6, then a modified integer' is set equal to integer−4 and a modified frac1' is set equal to frac1+250. On the other hand, if frac1 is not less than 6, then a modified integer' is set equal to integer−3 and a modified frac1' is set equal to frac1−6. The modified frac1' is provided to the summer leading to the appropriate sigma delta converter, in the embodiment of FIG. 6, summer 38 preceding to sigma delta converter 34. The modified integer' is provided to the summer 40 preceding the integer divider 16.

The processing of the integer and fraction portions, frac1, frac2 and frac3, may be implemented only when the frequency is changed. The processing may be performed by a processor in a personal computer, by a main processor or keyboard control unit in a product. Pre-computing the integer and fractional numbers for a new output frequency further reduces the computational load on the sigma-delta converters.

Lastly, one of the problems with sigma-delta converters is that for certain input numbers, they can generate very short patterns instead of the desired very long, noise-like patterns desired. In a frequency synthesizer, these patterns generate undesired spurious phase modulation. In the cascaded design, for each sigma-delta converter that is driven by another sigma-delta converter (i.e., receives output from another sigma-delta converter), this is not a problem because instead of having a constant input, it is driven by the noise-like output of the previous stage.

However, in the first stage of the cascaded design, i.e., for the lowest sigma-delta converter, some technique should be used to address this problem. Miller, in U.S. Pat. No. 5,038,117, suggests always setting the least significant bit (lsb) to '1'. Others have used a dither signal. These techniques may be used in accordance with the invention.

However, for the software implementation of the invention, it has been found that it is possible to add '1' to the lsb every fourth cycle. This is quite effective in breaking up the patterns and yet does not require any increase in complexity.

Thus, disclosed above is a fractional-N frequency synthesizer which provides significant advantages over conventional fractional-N synthesizers as discussed above. Such frequency synthesizers in accordance with the invention can be used in various fields, including but not limited to the field of radio.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

I claim:

1. A frequency synthesizer utilizing fractional-N synthesis, comprising:
    a phase detector having an input receivable of a reference frequency;
    a loop filter arranged to filter a control signal generated by the phase detector;
    a tunable oscillator arranged to receive the filtered control signal from said loop filter and provide an output frequency;

an integer divider arranged to receive the output frequency of said oscillator, divide the output frequency by a division control number (N+F) and provide the divided output frequency to said phase detector, the division control number being made up of an integer (N) and a fraction portion (F) separated into at least two different fractions;

generating means for generating the fraction portion (F) of the division control number, said generating means comprising at least two sigma-delta converters, each of said sigma delta converters processing a respective one of the at least two fractions, one of said sigma-delta converters processing a smaller fraction being driven at a lower clock rate than one of said sigma-delta converters processing the largest fraction; and a first summer arranged to combine the fraction portion (F) of the division control number generated by said generating means and the integer (N) to form the division control number, said integer divider receiving the division control number from said first summer.

2. The frequency synthesizer of claim 1, wherein said at least two sigma-delta converters comprise a first sigma delta converter arranged to receive a first fractional value (F1) and output a first fraction (F1/P1) and a second sigma-delta converter, said generating means further comprising a second summer arranged to combine the first fraction (F1/P1) and a second fractional value (F2) and provide the sum to said second sigma-delta converter, said second sigma-delta converter outputting a second fraction (F2/P2+F1/(P1 P2)) which constitutes the fraction portion of the division control number.

3. The frequency synthesizer of claim 2, wherein said first sigma-delta converter is driven at a lower clock rate than said second sigma-delta converter.

4. The frequency synthesizer of claim 3, further comprising a frequency divider for dividing a clock frequency, said first sigma-delta converter being arranged after said frequency divider and said second sigma-delta converter being arranged before said frequency divider such that said second sigma-delta converter is driven at the clock frequency and said first sigma-delta converter is driven at a divided clock frequency.

5. The frequency synthesizer of claim 4, wherein the clock frequency is the reference frequency.

6. The frequency synthesizer of claim 4, wherein the clock frequency is the output frequency of said integer divider.

7. The frequency synthesizer of claim 1, wherein said at least two sigma-delta converters comprise a first sigma delta converter, a second sigma-delta converter and a third sigma-delta converter, said first sigma delta converter being arranged to receive a first fractional value (F1) and output a first fraction (F1/P1), said generating means further comprising:

a second summer arranged to combine the first fraction (F1/P1) and a second fractional value (F2) and provide the sum (F2+F1/P1) to said second sigma-delta converter, said second sigma-delta converter outputting a second fraction (F2/P2+F1/(P1 P2)); and a third summer arranged to combine the second fraction (F2/P2+F1/(P1 P2)) and a third fractional value (F3) and provide the sum (F3+(F2/P2+F1/(P1 P2))) to said third sigma-delta converter, said third sigma-delta converter outputting a third fraction (F3/P3+F2/(P2 P3)+F1/(P1 P2 P3))) which constitutes the fraction portion of the division control number.

8. The frequency synthesizer of claim 7, wherein said first and second sigma-delta converter are driven at a lower clock frequency than said third sigma-delta converter.

9. The frequency synthesizer of claim 8, further comprising a first frequency divider for dividing a clock frequency, said first and second sigma-delta converters being arranged after said first frequency divider and said third sigma-delta converter being arranged before said first frequency divider such that said third sigma-delta converter is driven at the clock frequency and said first and second sigma-delta converter are driven at a divided clock frequency.

10. The frequency synthesizer of claim 9, further comprising a second frequency divider arranged after said first frequency divider for further dividing the clock frequency, said first sigma-delta converter being arranged after said second frequency divider such that said first sigma-delta converter is driven at a lower clock frequency than said second sigma-delta converter.

11. A frequency synthesizer utilizing fractional-N synthesis, comprising:

a phase detector having an input receivable of a reference frequency;

a loop filter arranged to filter a control signal generated by the phase detector;

a tunable oscillator arranged to receive the filtered control signal from said loop filter and provide an output frequency;

an integer divider arranged to receive the output frequency of said oscillator, divide the output frequency by a division control number (N+F) and provide the divided output frequency to said phase detector, the division control number being made up of an integer (N) and a fraction portion (F) separated into at least two different fractions;

a first sigma delta converter arranged to receive a first fractional value (F1) and output a first fraction (F1/P1);

a first summer arranged to combine the first fraction (F1/P1) and a second fractional value (F2);

a second sigma-delta converter arranged to receive the sum from said first summer (F2+F1/P1) and output a second fraction (F2/P2+F1/(P1 P2)) which constitutes the fraction portion of the division control number; and a second summer arranged to combine the fraction portion (F2/P2+F1/(P1 P2)) of the division control number and the integer (N) and output the sum to said integer divider (N+F2/P2+F1/(P1 P2));

the first fraction being smaller than the second fraction and said first sigma-delta converter being driven at a lower clock rate than said second sigma-delta converter.

12. The frequency synthesizer of claim 11, further comprising a frequency divider for dividing a clock frequency, said first sigma-delta converter being arranged after said frequency divider and said second sigma-delta converter being arranged before said frequency divider such that said second sigma-delta converter is driven at the clock frequency and said first sigma-delta converter is driven at a divided clock frequency.

13. The frequency synthesizer of claim 12, wherein the clock frequency is the reference frequency.

14. The frequency synthesizer of claim 12, wherein the clock frequency is an output frequency from said integer divider.

15. A frequency synthesizer utilizing fractional-N synthesis, comprising:

a phase detector having an input receivable of a reference frequency;

a loop filter arranged to filter a control signal generated by the phase detector;

a tunable oscillator arranged to receive the filtered control signal from said loop filter and provide an output frequency;

an integer divider arranged to receive the output frequency of said oscillator, divide the output frequency by a division control number (N+F) and provide the divided output frequency to said phase detector, the division control number being made up of an integer (N) and a fraction portion (F) separated into at least two different fractions;

a first sigma delta converter arranged to receive a first fractional value (F1) and output a first fraction (F1/P1);

a first summer arranged to combine the first fraction (F1/P1) and a second fractional value (F2);

a second sigma-delta converter arranged to receive the sum from said first summer (F2+F1/P1) and output a second fraction (F2/P2+F1/(P1 P2));

a second summer arranged to combine the second fraction (F2/P2+F1/(P1 P2)) and a third fractional value (F3);

a third sigma-delta converter arranged to receive the sum from the second summer (F3+F2/P2+F1/(P1 P2)) and output a third fraction (F3/P3+F2/(P2 P3)+F1/(P1 P2 P3) which constitutes the fraction portion of the division control number; and a third summer arranged to combine the fraction portion (F3/P3+F2/(P2 P3)+F1/(P1 P2 P3) of the division control number and the integer (N) and output the sum to said integer divider (N+(F3/P3+F2/(P2 P3)+F1/(P1 P2 P3)));

the first fraction being smaller than the second fraction, the second fraction being smaller than the third fraction and said first and second sigma-delta converters being driven at a lower clock rate than said third sigma-delta converter.

16. The frequency synthesizer of claim 15, further comprising a first frequency divider for dividing a clock frequency, said first and second sigma-delta converters being arranged after said first frequency divider and said third sigma-delta converter being arranged before said first frequency divider such that said third sigma-delta converter is driven at the clock frequency and said first and second sigma-delta converter are driven at a divided clock frequency.

17. The frequency synthesizer of claim 16, wherein the clock frequency is the reference frequency.

18. The frequency synthesizer of claim 16, wherein the clock frequency is an output frequency from said integer divider.

19. The frequency synthesizer of claim 16, further comprising a second frequency divider arranged after said first frequency divider for further dividing the clock frequency, said first sigma-delta converter being arranged after said second frequency divider such that said first sigma-delta converter is driven at a lower clock frequency than said second sigma-delta converter.

20. A method for synthesizing a frequency utilizing fractional-N synthesis, comprising the steps of:

inputting a reference frequency to a phase detector;

directing an output of the phase detector to a loop filter;

directing an output from the loop filter to a tunable oscillator;

directing an output frequency from the oscillator to an integer divider;

inputting a division control number made up of an integer and a fraction portion separated into at least two different fractions into the integer divider;

generating the fractions using at least two sigma-delta converters, each of the sigma delta converters processing a respective one of the at least two fractions;

driving one of the sigma-delta converters processing a smaller fraction at a lower clock rate than one of the sigma-delta converters processing the largest fraction;

dividing the output frequency from the oscillator by the division control number in the integer divider; and directing the output frequency from the integer divider to the phase detector.

21. The method of claim 20, wherein the step of generating the fraction portion comprises the steps of:

providing a first sigma delta converter and a second sigma-delta converter;

inputting a first fractional value to the first sigma-delta converter;

combining a first fraction output from the first sigma-delta converter and a second fractional value; and inputting the combined first fraction and the second fractional value to the second sigma-delta converter, a second fraction output from the second sigma-delta converter being combined with the integer to form the division control number.

22. The method of claim 21, wherein the first sigma-delta converter is driven at a lower clock rate than the second sigma-delta converter.

23. The method of claim 21, further comprising the steps of:

dividing a clock frequency;

driving the second sigma-delta converter at the undivided clock frequency; and driving the first sigma-delta converter at the divided clock frequency.

24. The method of claim 23, wherein the clock frequency is the reference frequency.

25. The method of claim 23, wherein the clock frequency is the output frequency of the integer divider.

26. The method of claim 20, wherein the step of generating the fraction portion comprises the steps of:

providing a first sigma delta converter, a second sigma-delta converter and a third sigma-delta converter;

inputting a first fractional value to the first sigma-delta converter;

combining a first fraction output from the first sigma-delta converter and a second fractional value;

inputting the combined first fraction and the second fractional value to the second sigma-delta converter;

combining a second fraction output from the second sigma-delta converter and a third fractional value; and inputting the combined second fraction and the third fractional value to the third sigma-delta converter, a third fraction output from the third sigma-delta converter being combined with the integer to form the division control number.

27. The method of claim 26, wherein the first and second sigma-delta converter are driven at a lower clock frequency than the third sigma-delta converter.

28. The method of claim 26, further comprising the steps of:

dividing a clock frequency;

driving the third sigma-delta converter at the undivided clock frequency; and driving the first and second sigma-delta converter at the divided clock frequency.

29. The method of claim 26, further comprising the steps of:
- dividing a clock frequency;
- driving the third sigma-delta converter at the undivided clock frequency;
- driving the second sigma-delta converter at the divided clock frequency;
- further dividing the clock frequency; and
- driving the first sigma-delta converter at the twice-divided clock frequency.

30. A method for generating fractional values for input into sigma-delta converters designed to output an integer from −N to +M, comprising the steps of:
- dividing a desired output frequency by a reference frequency to obtain a division control number having an integer portion and a fraction portion;
- separating the fraction portion into a plurality of fractions;
- arranging the sigma-delta converters in a cascaded arrangement;
- providing a summer between each adjacent pair of cascaded sigma-delta converters and between the highest sigma-delta converter and an integer divider, each summer being arranged to receive an output from one of the sigma-delta converters and either the integer portion or one of the fractions;
- increasing the output from each sigma-delta converter by N; and
- subtracting N from the fractions or the integer portion being added by each summer and borrowing from a higher fraction or the integer portion when the fraction is less than N to thereby obtain modified fractions and a modified integer portion,
- whereby a result provided by each summer is greater than or equal to 0.

31. The method of claim 30, wherein the sigma-delta converters are MASH111 converters and N equals 3 and M equals 4.

32. The method of claim 30, further comprising the steps of pre-computing the modified fraction portions and modified integer portion for another desired frequency and then changing the frequency to the desired frequency for which the modified fraction portions and modified integer portion have been pre-computed.

* * * * *